United States Patent
Llewellyn et al.

(10) Patent No.: US 7,443,905 B1
(45) Date of Patent: Oct. 28, 2008

(54) APPARATUS AND METHOD FOR SPREAD SPECTRUM CLOCK GENERATOR WITH ACCUMULATOR

(75) Inventors: William Llewellyn, San Jose, CA (US); Ha Chu Vu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 699 days.

(21) Appl. No.: 10/804,877

(22) Filed: Mar. 19, 2004

(51) Int. Cl.
*H04B 1/69* (2006.01)
*H03C 3/06* (2006.01)

(52) U.S. Cl. .......................... 375/130; 375/146; 332/128

(58) Field of Classification Search .................. 375/130, 375/375, 376, 116, 204, 200, 261, 259, 308, 375/146; 327/156, 158; 455/113, 76; 331/57, 331/17, 78; 713/400, 500, 600; 332/128
See application file for complete search history.

(56) References Cited

U.S. PATENT DOCUMENTS

| | | | | |
|---|---|---|---|---|
| 4,182,988 A * | 1/1980 | Murakami | ................ | 375/280 |
| 4,697,277 A * | 9/1987 | van Rassel | ................ | 375/366 |
| 5,152,005 A * | 9/1992 | Bickley | ................ | 455/76 |
| 5,488,627 A * | 1/1996 | Hardin et al. | ................ | 375/139 |
| 5,631,920 A * | 5/1997 | Hardin | ................ | 375/130 |
| 5,847,617 A * | 12/1998 | Reddy et al. | ................ | 331/57 |
| 5,907,253 A * | 5/1999 | Davis et al. | ................ | 327/156 |
| 6,580,432 B1 * | 6/2003 | Leung et al. | ................ | 345/558 |
| 6,760,571 B2 * | 7/2004 | Prockup | ................ | 455/113 |
| 7,079,616 B2 * | 7/2006 | Castiglione et al. | ......... | 375/376 |
| 2002/0067773 A1 * | 6/2002 | Jackson et al. | ............. | 375/308 |
| 2002/0145478 A1 * | 10/2002 | Chang | ................ | 331/78 |
| 2003/0039330 A1 | 2/2003 | Castiglione et al. | | |
| 2003/0053577 A1 * | 3/2003 | Watarai | ................ | 375/375 |
| 2003/0058053 A1 * | 3/2003 | Jeon et al. | ................ | 331/17 |

FOREIGN PATENT DOCUMENTS

| | | | | |
|---|---|---|---|---|
| JP | 59063893 A | * | 4/1984 | |
| JP | 09063206 A | * | 3/1997 | |

* cited by examiner

*Primary Examiner*—Don N. Vo
(74) *Attorney, Agent, or Firm*—Darby & Darby PC; Matthew M. Gaffney

(57) ABSTRACT

A method and apparatus for spread spectrum clock generation is provided. Modulation of the clock signal may be accomplished with an N/N−1 clock divider. The N/N−1 clock divider is configured to divide the clock signal by N or N−1, depending on the carry output signal of an accumulator circuit. The accumulator circuit is configured to provide the carry output signal in response to a modulating waveform signal. The modulating waveform signal may be a triangle wave, a sinusoidal wave, another waveform appropriate for spread-spectrum clock generation, and the like.

20 Claims, 5 Drawing Sheets

US 7,443,905 B1

APPARATUS AND METHOD FOR SPREAD SPECTRUM CLOCK GENERATOR WITH ACCUMULATOR

FIELD OF THE INVENTION

The invention is related to clock generation, and in particular, to an apparatus and method for spread spectrum clock generation where the modulation is accomplished using a carry output of an accumulator circuit.

BACKGROUND OF THE INVENTION

Fixed-frequency clocks are standard in virtually any piece of electronic equipment that includes digital circuitry, such as personal computers, cell phones, and microwave ovens. However, fixed-frequency clocks can cause electro-magnetic interference (EMI) in electronic devices.

Spread Spectrum Clock Generation (SSCG) is one technique that may be used to reduce EMI. Prior to the inception of SSCG, the principal methods used to mitigate EMI were shielding and filtering with passive components. However, these conventional techniques have been less practical to use when electronic devices were more complex, mobile, and/or operated at higher clock frequencies. Shielding, in particular, becomes unpractical as clock speeds increase and form factors decrease for electronic devices. Increased shielding adds to the size, weight and overall cost of an electronic device. Additionally, filtering often needs to be tuned or manually adjusted on a per-device basis to meet EMI requirements, further increasing manufacturing costs.

On the other hand, SSCG provides system-wide coverage as well as flexibility. Further, it does not interfere with signal-to-signal timing relationships (set-up and hold times). Since SSCG allows for less shielding and passive filtering; it can reduce the size and cost of an electronic device.

SSCG diminishes the EMI emitted by a digital system by frequency modulating the system's master clock with a low-frequency signal. This modulation changes the frequency spectrum of the resultant clock from a single spike to a reduced amplitude carrier with sideband harmonics. This reduction in the carrier amplitude brings substantial benefits in EMI control. Often, most or all of the other clocks in the electronic device are slaved to the SSCG master clock, and as a result, significant EMI reduction can occur throughout the device.

BRIEF DESCRIPTION OF THE DRAWINGS

Non-limiting and non-exhaustive embodiments of the present invention are described with reference to the following drawings, in which.

DETAILED DESCRIPTION

Figure 1:
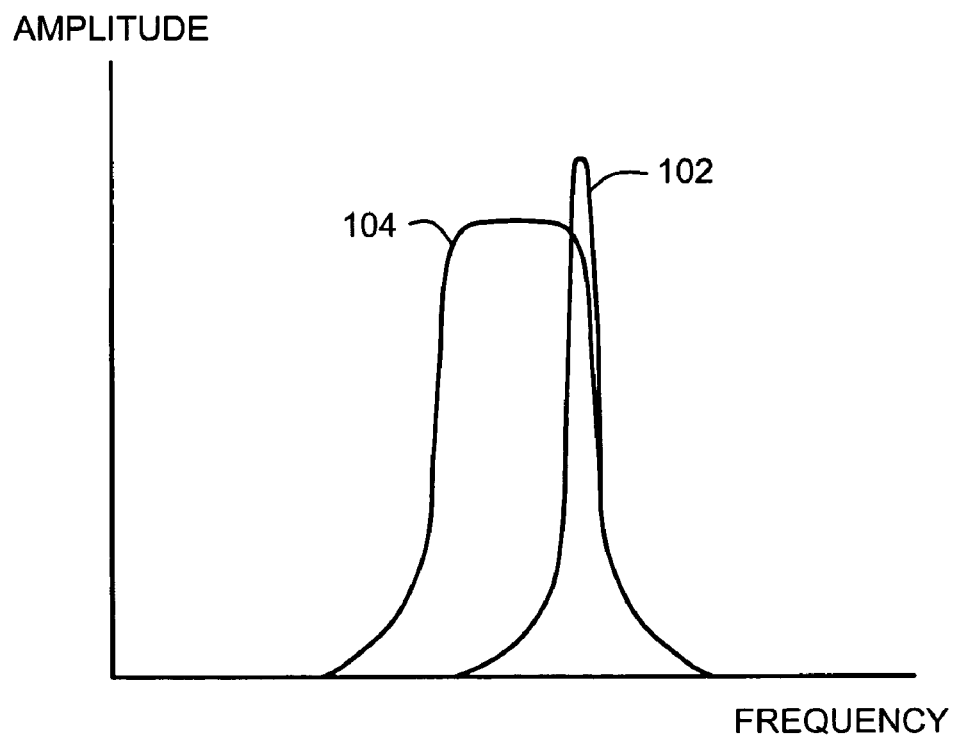
FIG. 1 illustrates a graph of amplitude versus frequency for waveforms of embodiments of a non-modulated clock signal and a corresponding modulated clock signal.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The term "connected" means a direct electrical connection between the items connected, without any intermediate devices. The phrase "in one embodiment," as used herein does not necessarily refer to the same embodiment, although it may. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a method and apparatus for spread spectrum clock generation. Modulation of the clock signal may be accomplished with an N/N−1 clock divider. The N/N−1 clock divider is configured to divide the clock signal by N or N−1, depending on the carry output signal of an accumulator circuit. The accumulator circuit is configured to provide the carry output signal in response to a modulating waveform signal. The modulating waveform signal may be a triangle wave, a sinusoidal wave, another waveform appropriate for spread-spectrum clock generation, and the like.

FIG. 1 illustrates a graph of amplitude versus frequency for waveforms of embodiments of non-modulated clock signal 102 and corresponding modulated clock signal 104. Signal 104 is provided by employing down-spread modulation on signal 102. By reducing the energy at each carrier frequency, EMI is reduced.

FIG. 1 illustrates an example in which the frequency of the clock signal is spread to the left. In other embodiments, the frequency may be spread to the right, spread symmetrically, and the like. In one embodiment, down-spread modulation from approximately −0.5 percent to −1.5 percent may be employed to reduce the strength of the carrier by approximately 2 to 18 dB. In one embodiment, a modulating frequency of approximately 30 kHz may be employed. In other embodiments, different modulation parameters are employed.

Figure 2:
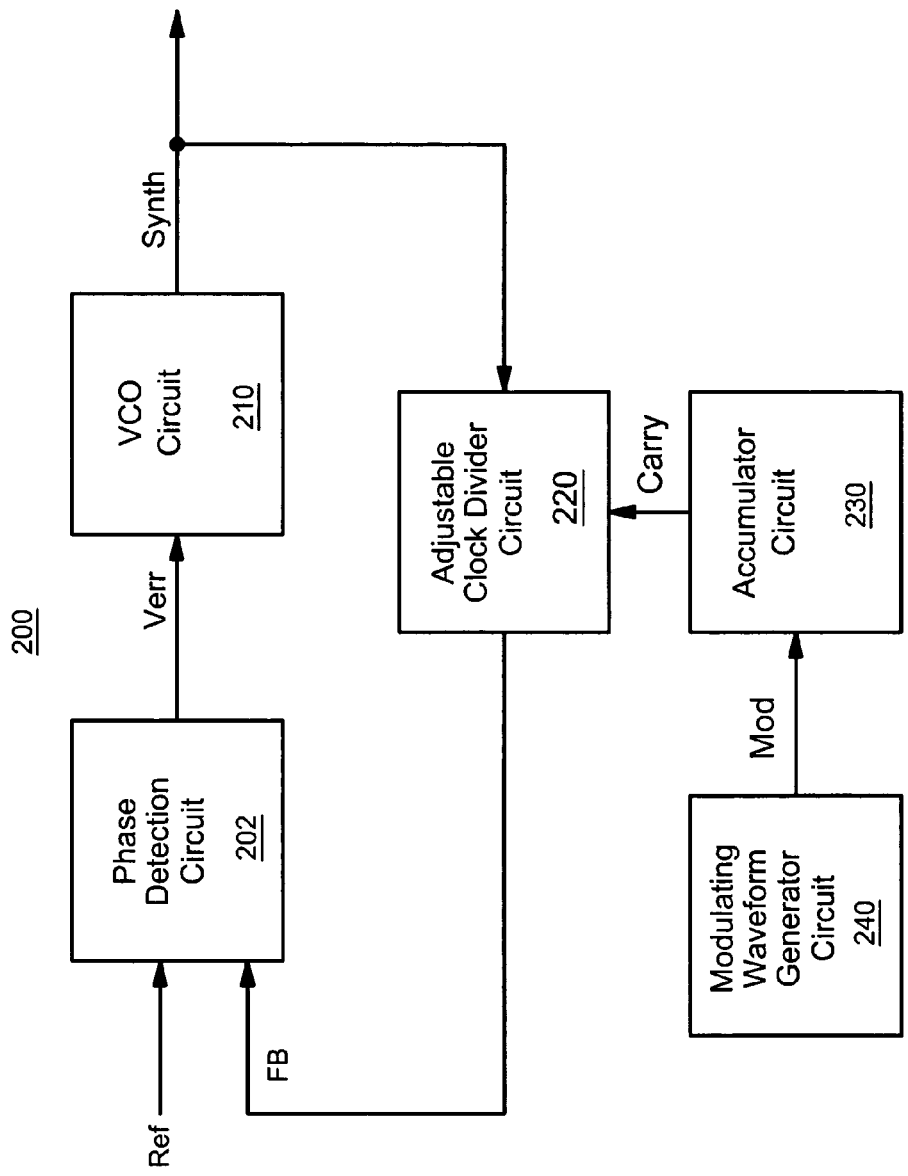
FIG. 2 shows a block diagram of an embodiment of a circuit for spread-spectrum clock generation.

FIG. 2 shows a block diagram of an embodiment of circuit 200. Circuit 200 may include phase detection circuit 202, voltage controlled oscillator (VCO) circuit 210, adjustable clock divider circuit 220, accumulator circuit 230, and modulating waveform generator circuit 240.

Phase detection circuit 202 may provide an error signal (Verr) from a feedback signal (FB) and a reference signal (Ref). More specifically, it may provide signal Verr such that signal Verr has a voltage that is proportional to the time difference between leading edges of signal Ref and signal FB.

In one embodiment, signal Ref has a frequency of approximately 27 MHz. In other embodiments, other frequencies may be used for signal Ref. VCO circuit 210 is configured to provide a synthesized signal (Synth) from signal Verr such that signal Synth has a frequency that is associated with the voltage of signal Verr.

Adjustable clock divider circuit 220 may provide signal FB from signal Synth in response to a carry signal (Carry) as follows. If signal Carry corresponds to a first logic level (e.g. low), adjustable clock divider circuit 220 divides the frequency of signal Synth by a first number to provide signal FB. Alternatively, if signal Carry corresponds to a second logic level (e.g. high), adjustable clock divider circuit 220 divides the frequency of signal Synth by a second number to provide signal FB.

Additionally, circuit 200 is arranged such that the frequency signal FB follows the frequency of signal Ref. Signal Verr is associated with the phase difference between signal FB and signal Ref. and the feedback operation of circuit 200 adjusts the frequency of signal FB to match the frequency of signal Ref.

Also, modulating waveform generator circuit 240 is configured to provide a modulating waveform signal (Mod). Signal Mod may include a multiple-bit digital word that varies over time as a modulating waveform. The modulating waveform may include a triangle wave, a sinusoidal wave, another type of waveform suitable for spread spectrum modulation, and the like. In one embodiment, the modulating waveform is suitable for providing the down-spread modulation illustrated in FIG. 1.

Additionally, signal Synth is a spread-spectrum clock signal that may either be used directly, or further modified.

Figure 3:
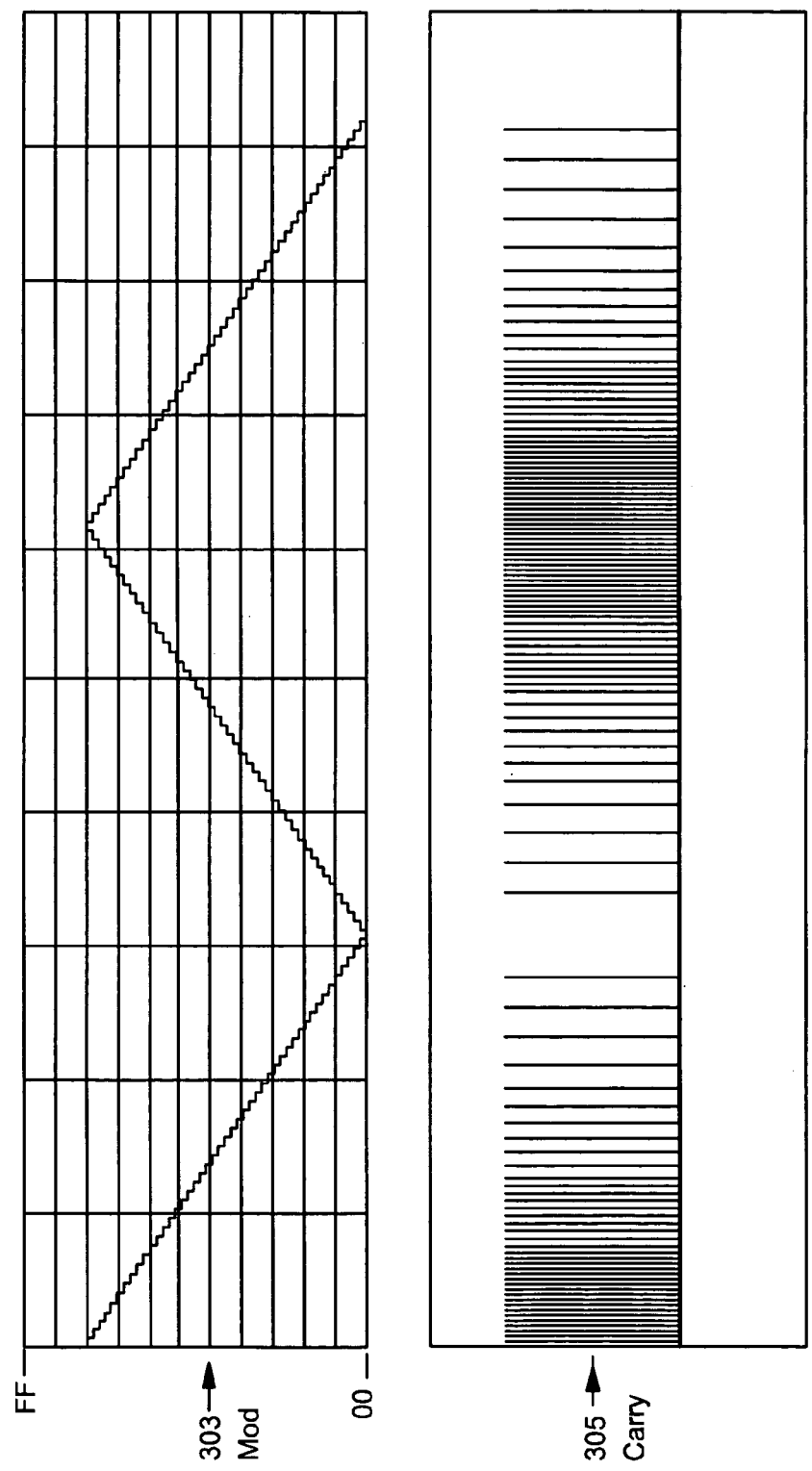
FIG. 3 illustrates a timing diagram of waveforms of embodiments of the carry signal and the modulating waveform signal from the circuit of FIG. 2.

Accumulator circuit 230 is configured to provide a carry signal (Carry) from signal Mod. More specifically, accumulator circuit 230 may be arranged such that signal Carry is asserted if an output register in accumulator circuit 230 overflows. Also, accumulator circuit 230 may retain the residue value when each overflow occurs and restart at that value. Accordingly, as illustrated in FIG. 3, accumulator circuit 210 may provide signal Carry such that the frequency with which signal Carry is asserted is proportional to the amplitude of signal Mod. The frequency with which signal Carry is asserted in turn effects the feedback division of adjustable clock divider circuit 210 such that the frequency of signal Synth follows the amplitude of signal Mod.

FIG. 3 illustrates a timing diagram showing embodiments of waveform 303 of an embodiment of signal Carry and waveform 305 of an embodiment of signal Mod. As shown in FIG. 3 and as previously discussed, the frequency with which signal Carry is asserted is proportional to the amplitude of signal Mod. In one embodiment, signal Mod is an eight-bit digital signal, as shown in FIG. 3.

Figure 4:
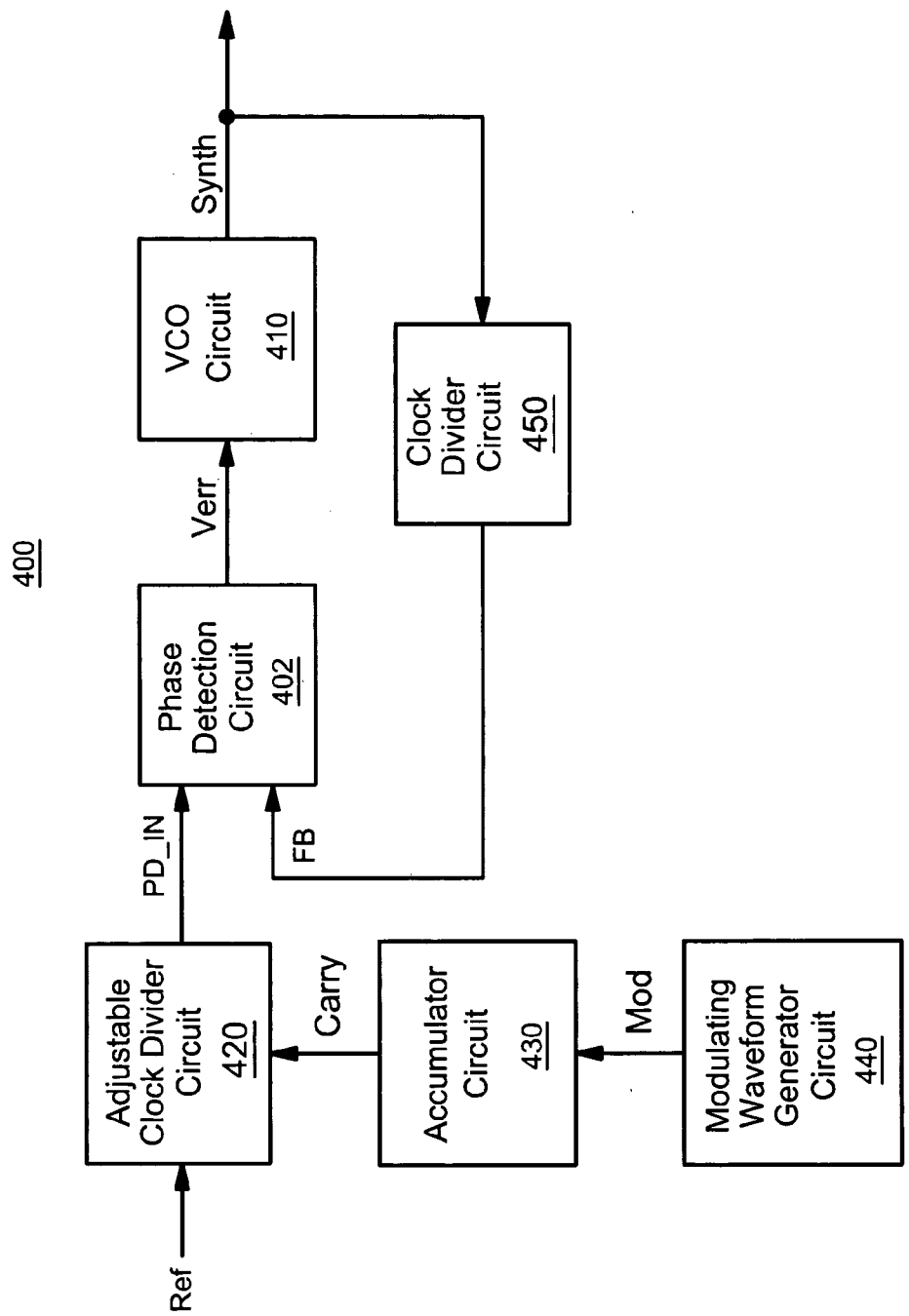
FIG. 4 shows a block diagram of another embodiment of a circuit for spread-spectrum clock generation.

FIG. 4 shows a block diagram of an embodiment of circuit 400. Components of circuit 400 may operate in a substantially similar manner as like-named components of circuit 200, albeit different in some ways. In circuit 400, adjustable clock divider circuit 420 is configured to divide signal Ref rather than signal Synth. Also, adjustable clock divider circuit 420 is configured to provide signal PD_IN from signals Ref and Carry. Phase detection circuit 402 is configured to provide signal Verr from signal PD_In and signal FB. Additionally, clock divider circuit 450 is configured to provide signal FB from signal Synth.

Figure 5:
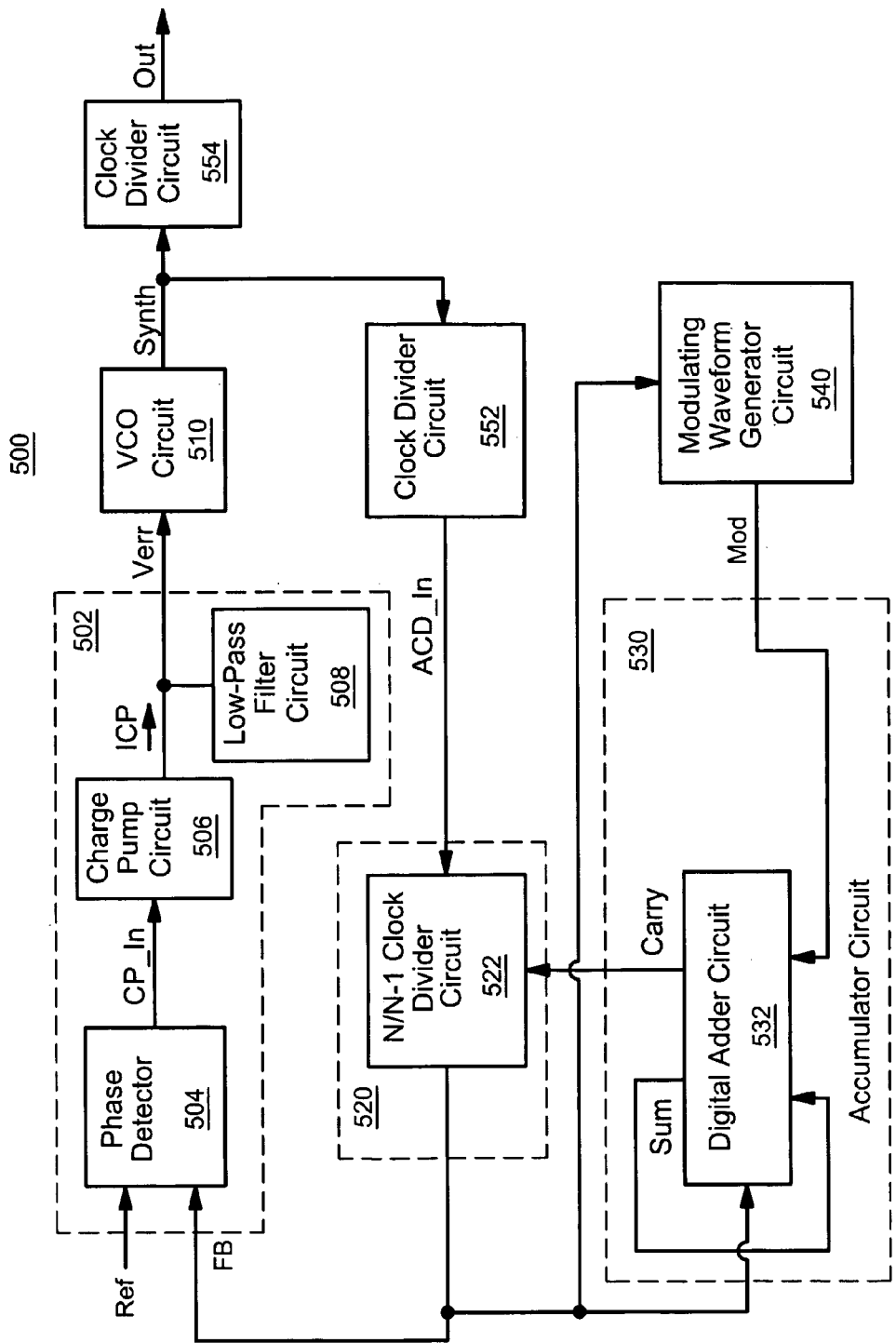
FIG. 5 illustrates a block diagram of an embodiment of the circuit of FIG. 2, arranged in accordance with aspects of the present invention.

FIG. 5 illustrates a block diagram of circuit 500, which is an embodiment of circuit 200. Components of circuit 500 may operate in a substantially similar manner as like-named components of circuit 200, albeit different in some ways. In circuit 500, phase detection circuit 502 includes phase detector 504, charge pump circuit 506, and low-pass filter circuit 508. Adjustable clock divider circuit 520 includes N/N−1 Clock Divider Circuit 522. Additionally, accumulator circuit 530 includes digital adder circuit 532. In one embodiment, circuit 500 further includes clock divider circuit 554.

Phase detector 504 may compare the phases of signal Ref and signal FB, and provide a charge pump input signal (CP_In) in response to the comparison. Charge pump circuit 506 may provide a charge pump current (ICP) from signal CP_In. Further, low-pass filter circuit 508 may provide signal Verr from current ICP.

N/N−1 clock divider circuit 522 is configured to provide signal FB by dividing the frequency of signal ACD_In by N if signal Carry corresponds to the first logic level (e.g. low), and dividing the frequency of signal ADC_In by N−1 if signal Carry corresponds to the second logic level (e.g. high). According to one embodiment, N is 37, and clock divider circuit 552 is configured to divide signal Synth by 2 to provide signal ACD_In. Accordingly, in this embodiment, signal Synth has a frequency of that is 74 (37*2) times greater than the frequency of signal Ref if Carry corresponds to the first logic level, and Synth has a frequency that is 72 (36*2) times greater than the frequency of signal Ref if Carry corresponds to the second logic level.

In one embodiment, the more frequently signal Carry is asserted, the more frequently N/N−1 clock divider circuit 522 switches from dividing by N to dividing by N−1. The decrease in the feedback division results in a corresponding reduction in the frequency of signal Synth. The overall effect of this architecture is that the frequency of signal Synth follows the value of signal Mod. In one embodiment, as the value of signal Mod increases, the frequency of signal Synth decreases.

In one embodiment, clock divider circuit 554 is configured to provide an output clock signal (Out) such that a frequency that is associated with signal Out corresponds to a frequency that is associated with signal Synth divided by a third number. According to one embodiment, the third number is 20. In other embodiments, a different frequency division may be used for clock divider circuit 554.

For a particular desired frequency of signal OUT, signal Synth is greater if clock divider circuit 554 is included in circuit 500. Accordingly, if clock divider circuit 554 is included, the difference in signal FB when N/N−1 clock divider circuit 522 divides by N, from when it divides by N−1, is smaller. Therefore, including post-scaling clock divider circuit 554 in circuit 500 allows greater resolution in the modulation.

In one embodiment, signal FB is used to clock digital adder circuit 532 and modulating waveform generator circuit 540. In other embodiments, timing control of digital circuit 532 and modulating waveform generator circuit 540 may be accomplished in other ways.

The architecture of circuit 500 is simple and flexible. Also, modulating waveform generator circuit 540 can be programmed to have a wide range of modulating frequencies and amplitudes. The shape, amplitude, and frequency of the modulating waveform are changeable.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for spread spectrum clock generation, comprising:
a spread spectrum clock generator that is arranged to provide an output clock signal, wherein the spread spectrum clock generator is arranged such that the output clock signal is a clock signal that is a spread-spectrum signal, and wherein the spread spectrum clock generator includes:
a phase detection circuit that is configured to provide an error signal from a reference signal and a feedback signal;
a voltage controlled oscillator circuit that is configured to provide a synthesized signal from the error signal, wherein the synthesized signal is a clock signal, and wherein the output clock signal is based, at least in part, on the synthesized signal;
a modulating waveform generator circuit that is configured to provide a modulating waveform signal that varies over time as a modulating waveform;
an accumulator circuit that is configured to provide a carry signal from the modulating waveform signal; and
an adjustable clock divider circuit that is configured to provide an adjustable clock divider output signal from an adjustable clock divider input signal, wherein the adjustable clock divider input signal is based at least in part on the synthesized signal, the feedback signal is based at least in part on the adjustable clock divider output signal, and wherein the adjustable clock divider circuit is configured to provide the adjustable clock divider output signal such that a frequency that is associated with the adjustable clock divider signal corresponds to the frequency associated with the adjustable clock divider input signal divided by:
a first number, if the carry signal is associated with a first logic level, and
a second number, if the carry signal is associated with a second logic level.

2. The circuit of claim 1, wherein the second number equals the first number minus one.

3. The circuit of claim 1, wherein the modulating waveform is suitable for reducing electromagnetic interference.

4. The circuit of claim 1, wherein the modulating waveform includes one of a triangle wave or a sinusoidal wave.

5. A circuit for spread spectrum clock generation, comprising:
a phase detection circuit that is configured to provide an error signal from a reference signal and a feedback signal;
a voltage controlled oscillator circuit that is configured to provide a synthesized signal from the error signal;
a modulating waveform generator circuit that is configured to provide a modulating waveform signal that varies over time as a modulating waveform;
an accumulator circuit that is configured to provide a carry signal from the modulating waveform signal;
an adjustable clock divider circuit that is configured to provide an adjustable clock divider output signal from an adjustable clock divider input signal, wherein the adjustable clock divider input signal is based at least in part on the synthesized signal, the feedback signal is based at least in part on the adjustable clock divider output signal, and wherein the adjustable clock divider circuit is configured to provide the adjustable clock divider signal such that a frequency that is associated with the adjustable clock divider signal corresponds to the frequency associated with the adjustable clock divider input signal divided by:
a first number, if the carry signal is associated with a first logic level, and
a second number, if the carry signal is associated with a second logic level; and
a clock divider circuit that is configured to provide an output clock signal from the synthesized signal.

6. A circuit for spread spectrum clock generation, comprising:
a phase detection circuit that is configured to provide an error signal from a reference signal and a feedback signal;
a voltage controlled oscillator circuit that is configured to provide a synthesized signal from the error signal;
a modulating waveform generator circuit that is configured to provide a modulating waveform signal that varies over time as a modulating waveform;
an accumulator circuit that is configured to provide a carry signal from the modulating waveform signal; and
an adjustable clock divider circuit that is configured to provide an adjustable clock divider output signal from an adjustable clock divider input signal, wherein the adjustable clock divider input signal is based at least in part on the synthesized signal, the feedback signal is based at least in part on the adjustable clock divider output signal, and wherein the adjustable clock divider circuit is configured to provide the adjustable clock divider output signal such that a frequency that is associated with the adjustable clock divider signal corresponds to the frequency associated with the adjustable clock divider input signal divided by:
a first number, if the carry signal is associated with a first logic level, and
a second number, if the carry signal is associated with a second logic level, wherein the accumulator circuit includes a digital adder circuit having first and second inputs, a sum output, and a carry output, wherein the digital adder circuit is arranged to receive the modulated waveform signal at the first input, the sum output is coupled to the second input, and wherein the digital adder circuit is configured to provide the carry signal at the carry output.

7. The circuit of claim 1, wherein the phase detection circuit includes a phase detector, a charge pump circuit, and a low-pass filter circuit.

8. The circuit of claim 1, wherein the spread spectrum clock generator further includes a clock divider circuit that is configured to provide the adjustable clock divider input signal from the synthesized signal.

9. The circuit of claim 5, wherein the clock divider circuit is configured to provide the output signal such that a frequency that is associated with the output clock signal corresponds to a frequency that is associated with the synthesized signal divided by a third number.

10. The circuit of claim 1, wherein the modulating waveform is suitable for spreading a frequency spectrum that is associated with the synthesized signal relative to a frequency spectrum that is associated with the reference signal according to a down-spread modulation.

11. The circuit of claim 1, wherein the modulating waveform signal includes a multiple-bit digital word that varies over time according to the modulating waveform.

12. A circuit for spread spectrum clock generation, comprising:

a phase detection circuit that is configured to provide an error signal from a reference signal and a feedback signal;

a voltage controlled oscillator circuit that is configured to provide a synthesized signal from the error signal;

a modulating waveform generator circuit that is configured to provide a modulating waveform signal that varies over time as a modulating waveform;

an accumulator circuit that is configured to provide a carry signal from the modulating waveform signal; and an adjustable clock divider circuit that is configured to provide an adjustable clock divider output signal from an adjustable clock divider input signal, wherein the adjustable clock divider input signal is based at least in part on the synthesized signal, the feedback signal is based at least in part on the adjustable clock divider output signal, and wherein the adjustable clock divider circuit is configured to provide the adjustable clock divider output signal such that a frequency that is associated with the adjustable clock divider signal corresponds to the frequency associated with the adjustable clock divider input signal divided by:

a first number, if the carry signal is associated with a first logic level, and a second number, if the carry signal is associated with a second logic level, wherein the modulating waveform is suitable for spreading a frequency spectrum that is associated with the synthesized signal relative to a frequency spectrum that is associated with the reference signal according to a down-spread modulation, and wherein the down-spread modulation is between approximately −0.5% to −1.5%.

13. A circuit for spread spectrum clock generation, comprising:

a spread spectrum clock generator that is arranged to provide an output clock signal, wherein the spread spectrum clock generator is arranged such that the output clock signal is a clock signal that is a spread-spectrum signal, and wherein the spread spectrum clock generator includes:

a phase detection circuit that is configured to provide an error signal from a phase detection input signal and a feedback signal;

a voltage controlled oscillator circuit that is configured to provide a synthesized signal from the error signal, wherein the feedback signal is based at least in part on the synthesized signal, wherein the synthesized signal is a clock signal, and wherein the output clock signal is based, at least in part, on the synthesized signal;

a modulating waveform generator circuit that is configured to provide a modulating waveform signal that varies over time as a modulating waveform;

an accumulator circuit that is configured to provide a carry signal from the modulating waveform signal; and an adjustable clock divider circuit that is configured to provide an adjustable clock divider output signal from an adjustable clock divider input signal, wherein the adjustable clock divider input signal is based at least in part on a reference signal, the phase detection input signal is based at least in part on the adjustable clock divider output signal, and wherein the adjustable clock divider circuit is configured to provide the adjustable clock divider output signal such that a frequency that is associated with the adjustable clock divider signal corresponds to the frequency associated with the adjustable clock divider input signal divided by:

a first number, if the carry signal is associated with a first logic level, and a second number, if the carry signal is associated with a second logic level.

14. The circuit of claim 13, wherein the spread spectrum clock generator further includes a clock divider circuit that is configured to provide the feedback signal from the synthesized signal.

15. The circuit of claim 13, wherein the second number equals the first number minus one.

16. The circuit of claim 13, wherein the modulating waveform includes at least one of a triangle wave or a sinusoidal wave.

17. The circuit of claim 13, wherein the modulating waveform signal includes a multiple-bit digital word that varies over time according to the modulating waveform.

18. The circuit of claim 13 further comprising:

a clock divider circuit that is configured to provide an output signal from the synthesized signal.

19. The circuit of claim 18, wherein the clock divider circuit is configured to provide the output signal such that a frequency that is associated with the output signal corresponds to a frequency that is associated with the synthesized signal divided by a third number.

20. A circuit for spread spectrum clock generation, comprising:

means for determining a phase difference between a reference signal and a feedback signal;

means for providing a synthesized signal from the determined phase difference, wherein the synthesized signal is a clock signal;

means for providing modulating waveform signal that includes a multiple-bit digital word that varies over time as a modulating waveform;

means for providing a carry signal from the modulating waveform signal such that a frequency of pulses in a logical level that is associated with the carry signal is determined according to a value that is associated with the multiple-bit digital word;

means for frequency division by a first number if the carry signal is associated with a first logic level; and means for frequency division by a second number if the carry signal is associated with a second logic level.

* * * * *

UNITED STATES PATENT AND TRADEMARK OFFICE
CERTIFICATE OF CORRECTION

PATENT NO. : 7,443,905 B1
APPLICATION NO. : 10/804877
DATED : October 28, 2008
INVENTOR(S) : William David Llewellyn et al.

It is certified that error appears in the above-identified patent and that said Letters Patent is hereby corrected as shown below:

Title page, Item (75), "Inventors", after William" insert -- David --.

Signed and Sealed this

Third Day of February, 2009

JOHN DOLL
*Acting Director of the United States Patent and Trademark Office*